United States Patent
Ono et al.

(10) Patent No.: US 9,448,255 B2
(45) Date of Patent: Sep. 20, 2016

(54) CAPACITANCE DETECTION DEVICE

(71) Applicant: KABUSHIKI KAISHA TOSHIBA, Minato-ku, Tokyo (JP)

(72) Inventors: Daiki Ono, Yokohama (JP); Jun Deguchi, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 176 days.

(21) Appl. No.: 14/331,927

(22) Filed: Jul. 15, 2014

(65) Prior Publication Data
US 2015/0233972 A1 Aug. 20, 2015

(30) Foreign Application Priority Data
Feb. 14, 2014 (JP) ................................. 2014-026221

(51) Int. Cl.
*G01R 27/26* (2006.01)
*G01R 1/44* (2006.01)

(52) U.S. Cl.
CPC ............. *G01R 1/44* (2013.01); *G01R 27/2605* (2013.01)

(58) Field of Classification Search
CPC ..... G01R 27/2605; G01R 1/44; G01L 9/105; G01L 9/16
USPC ................................................ 324/658–690
See application file for complete search history.

(56) References Cited

U.S. PATENT DOCUMENTS

| 3,828,333 A * | 8/1974 | Bryant | B60R 21/268 174/152 GM |
| 2013/0193532 A1* | 8/2013 | Horie | H01L 29/84 257/415 |

OTHER PUBLICATIONS

Related U.S. Appl. No. 14/178,012, Title: "DELTA/SIGMA Modulator", filed Feb. 11, 2014, First Named Inventor: Daiki Ono.
Sebastian Thiele et al, "Design of a Neutrally Buoyant Self-Powered Multi-Parameter Sensor for Data Logging in Flow Applications", IEEE Sensors 2009 Conference, pp. 1927-1930 (in English).
Philip C.John et al, "Signal Conditioner for MEMS based Piezoresistive sensor", 2010 5th International Conference on Industrial and Information Systems, ICIIS 2010, Jul. 29-Aug. 1, 2010, pp. 329-333 (in English).
Matti Paavola et al, "A Micropower ••-Based Interface Asic for a Capacitive 3-Axis Micro-Accelerometer", IEEE Journal of Solid-State Circuits, vol. 44, No. 11, Nov. 2009, pp. 3193-3210 (in English).
Mark Lemkin et al, "A Three-Axis Micromachined Accelerometer with a CMOS Position-Sense Interface and Digital Offset-Trim Electronics", IEEE Journal of Solid-State Circuits, vol. 34, No. 4, Apr. 1999, pp. 456-468 (in English).

(Continued)

*Primary Examiner* — Vincent Q Nguyen
(74) *Attorney, Agent, or Firm* — Holtz, Holtz & Volek PC

(57) ABSTRACT

According to one embodiment, a capacitance detection device includes a switched capacitor amplifying circuit including a variable capacitor and a reference capacitor, and a voltage applying circuit configured to apply, to the switched capacitor amplifying circuit, a reference voltage having a temperature characteristic for compensating fluctuation in an output voltage of the switched capacitor amplifying circuit due to a temperature characteristic of capacitance of the variable capacitor.

14 Claims, 10 Drawing Sheets

(56) References Cited

OTHER PUBLICATIONS

Paolo Bruschi et al, "A Current-Mode, Dual Slope, Integrated Capacitance-to-Pulse Duration Converter", IEEE Journal of Solid-State Circuits, vol. 42, No. 9, Sep. 2007, pp. 1884-1891 (in English).

T. Fujimori et al, "Tiny (0.72 mm2) Pressure Sensor Integrating MEMS and CMOS LSI With Back-End-of-Line MEMS Platform", Transducers 2009, Jun. 21-25, 2009, pp. 1924-1927 (in English).

S. Robinet et al, "A CMOS-SOI 2.45GHz Remote-Powered Sensor Tag", ISSCC 2008 / Session 15 / TD: Trends in Signal and Power Transmission / 15.1, 3 Pages (in English).

Li Jing-hu et al, "A | 0ppm/'C 1.8V Piecewise Curvature-corrected Bandgap Reference in O.5Jlm CMOS", 2009, pp. 416-419 (in English).

5

* cited by examiner

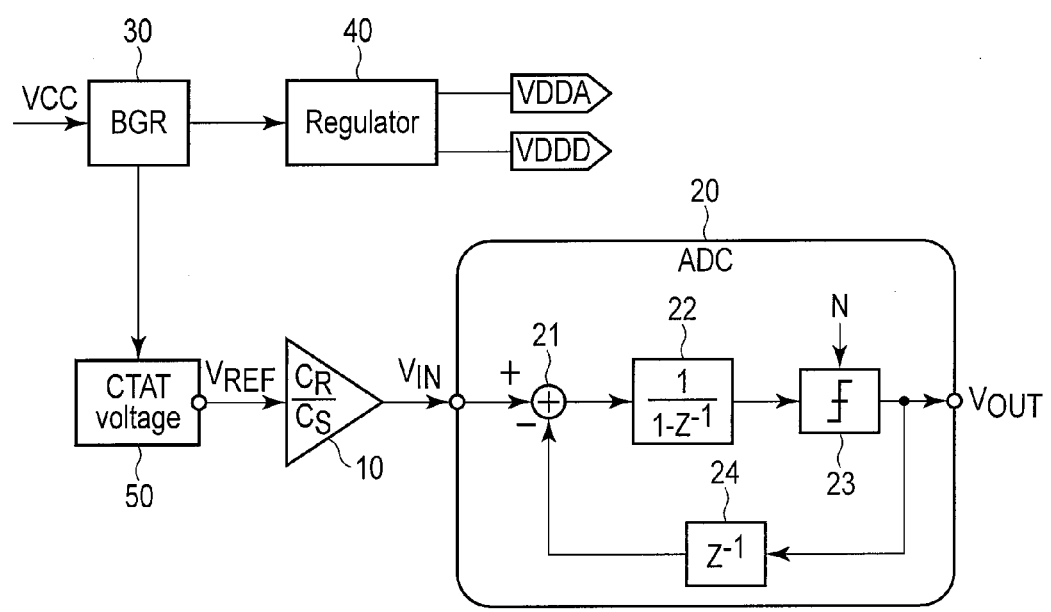
F I G. 1

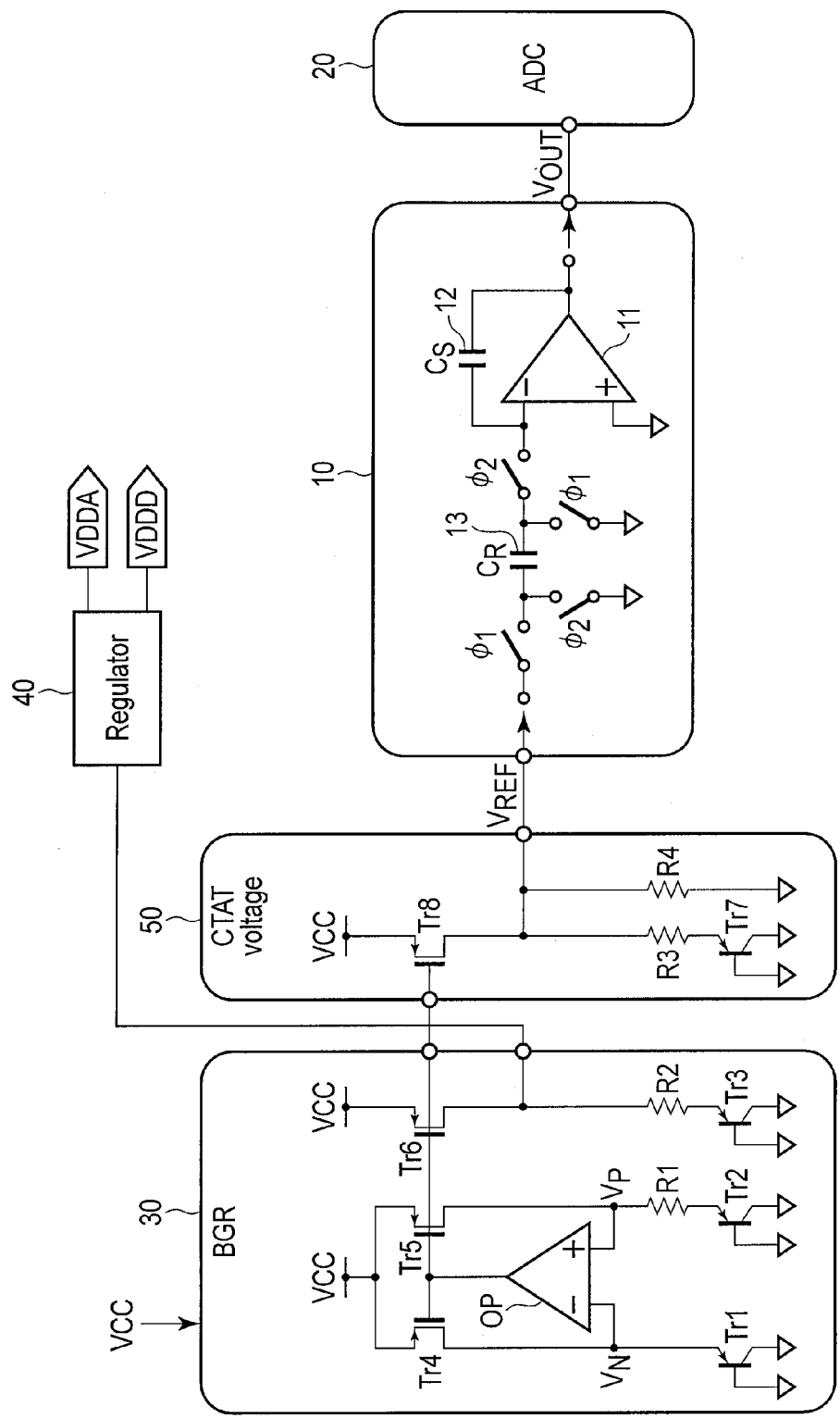
F I G. 2

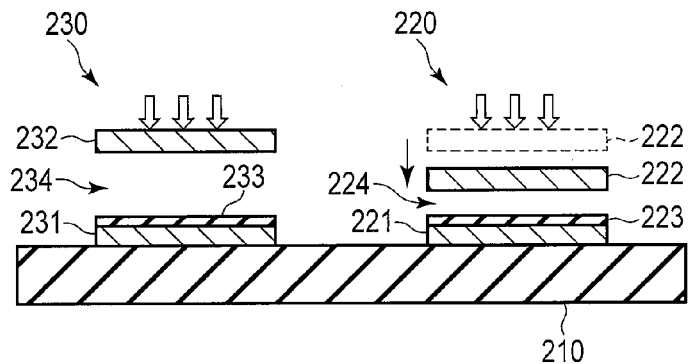
F I G. 3
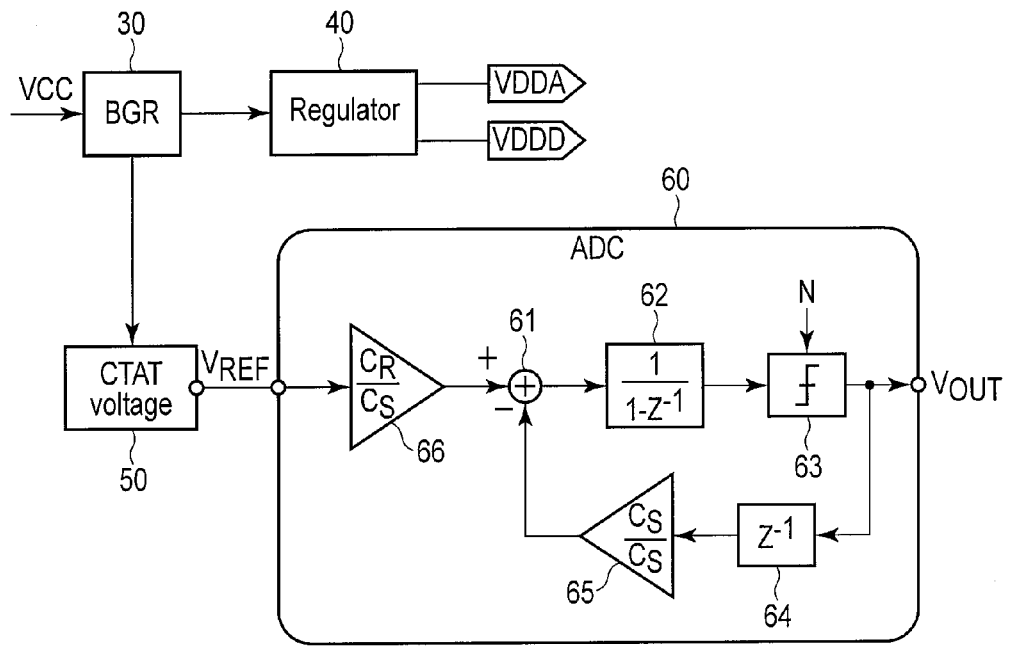
F I G. 4

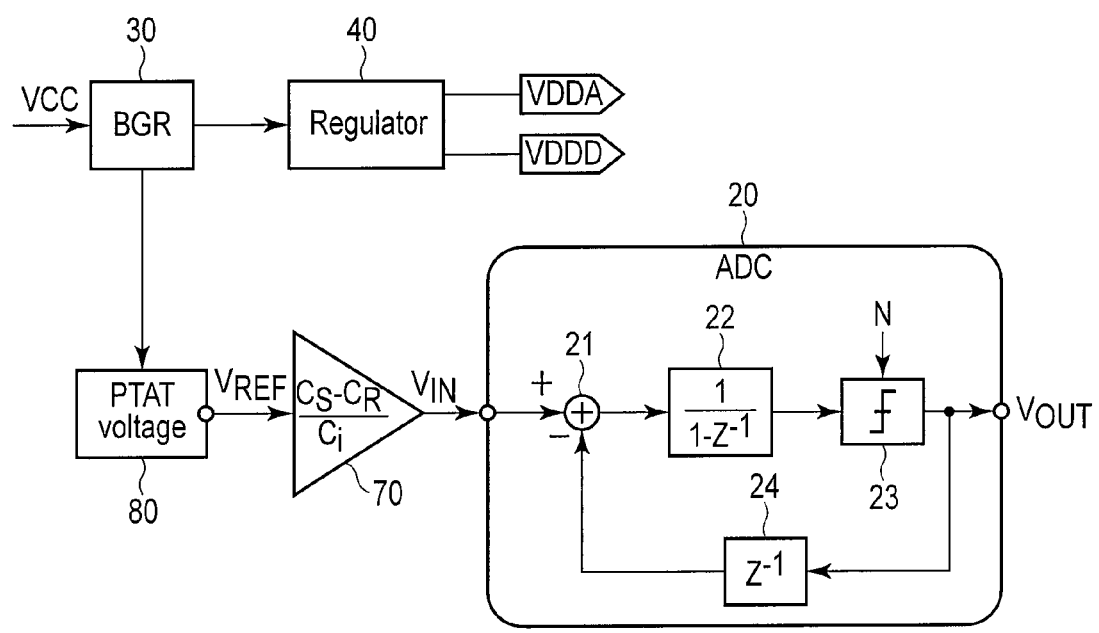
F I G. 6

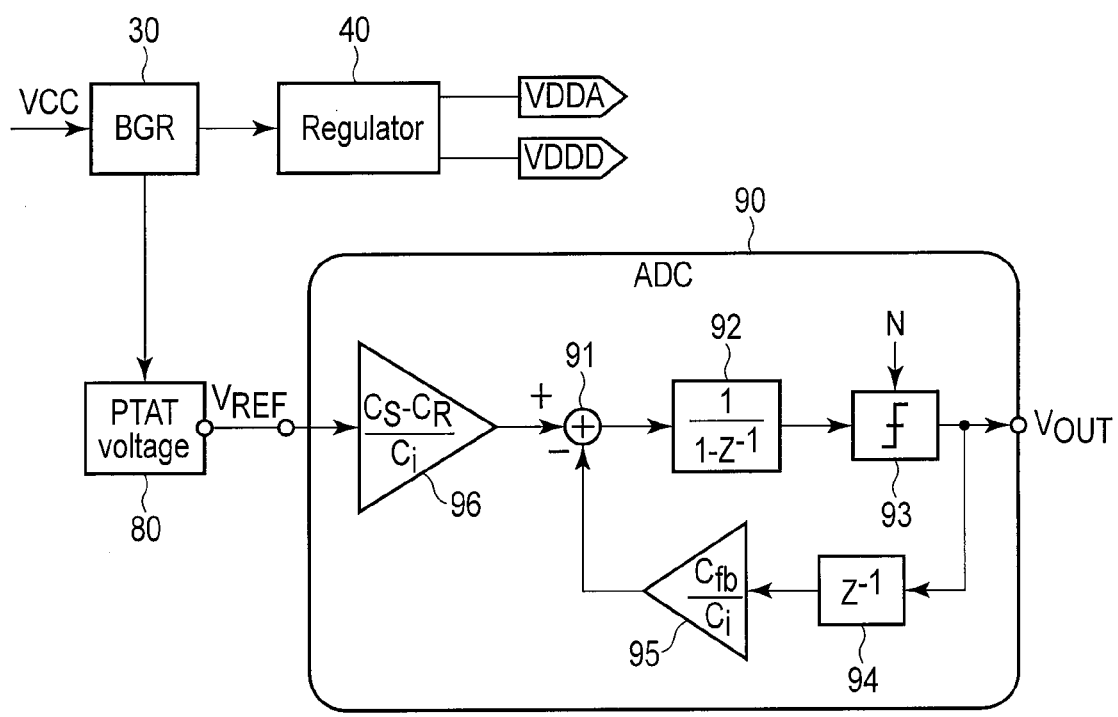
F I G. 8

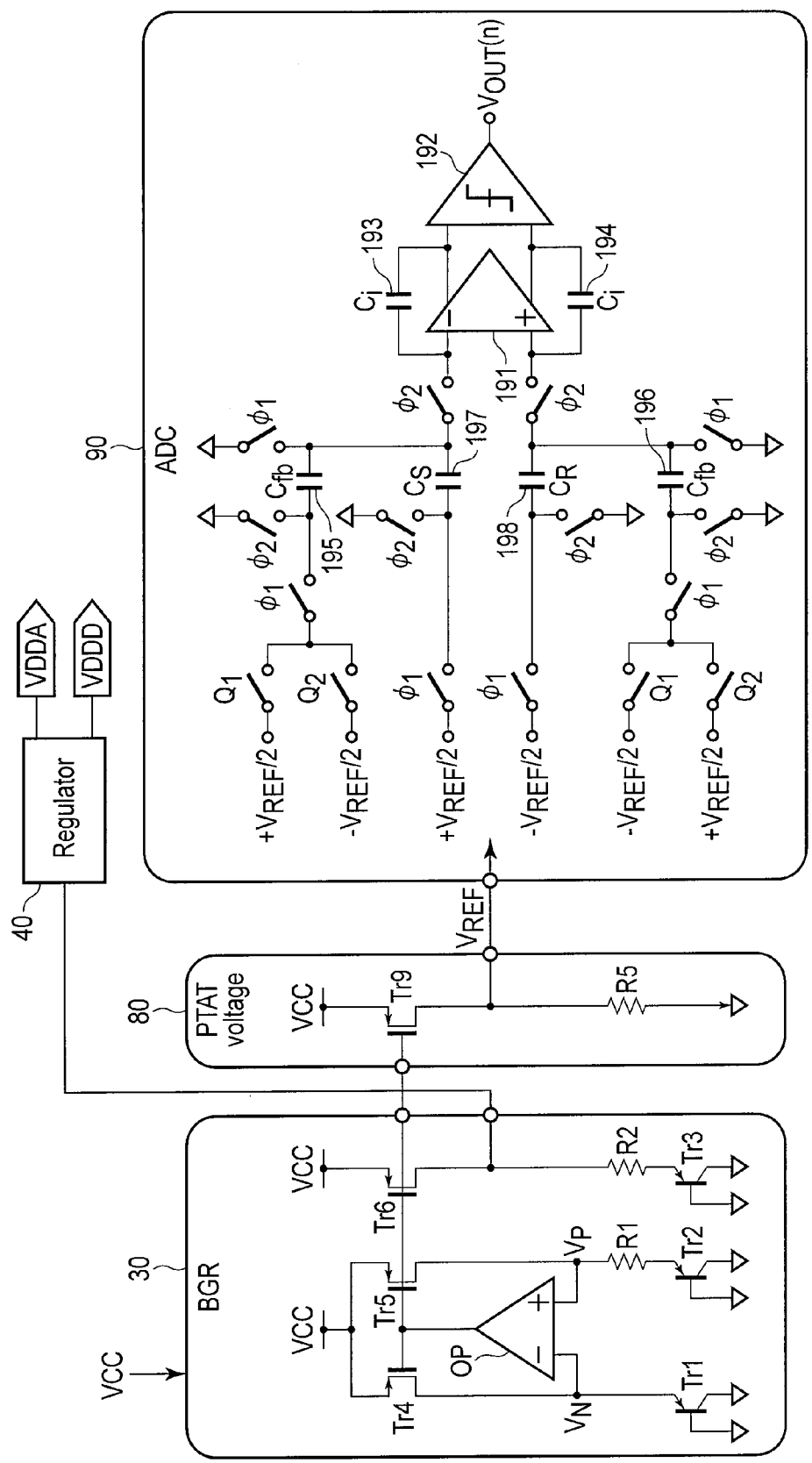
F I G. 9

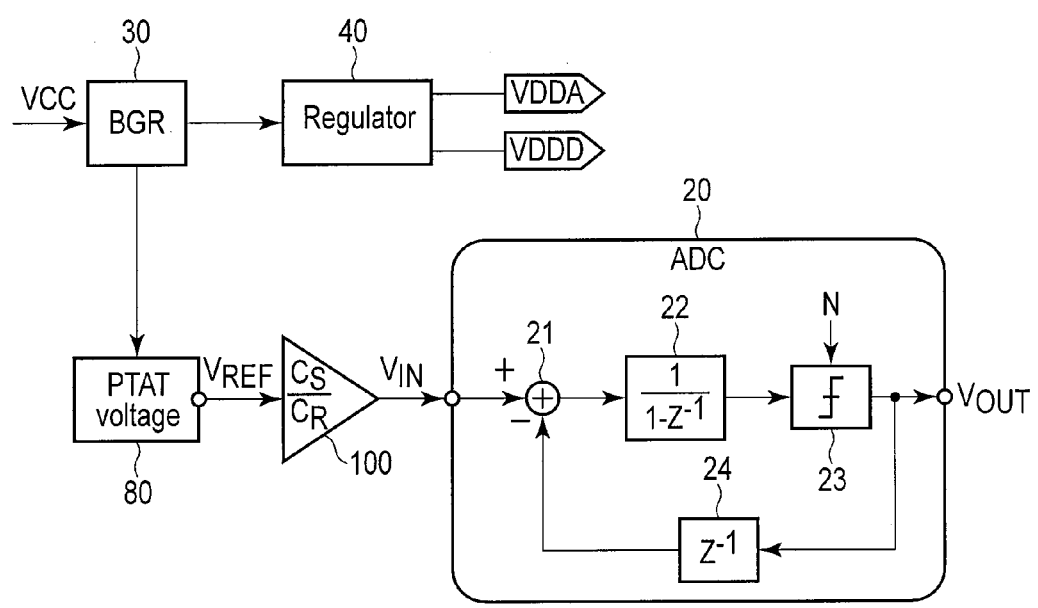
F I G. 10

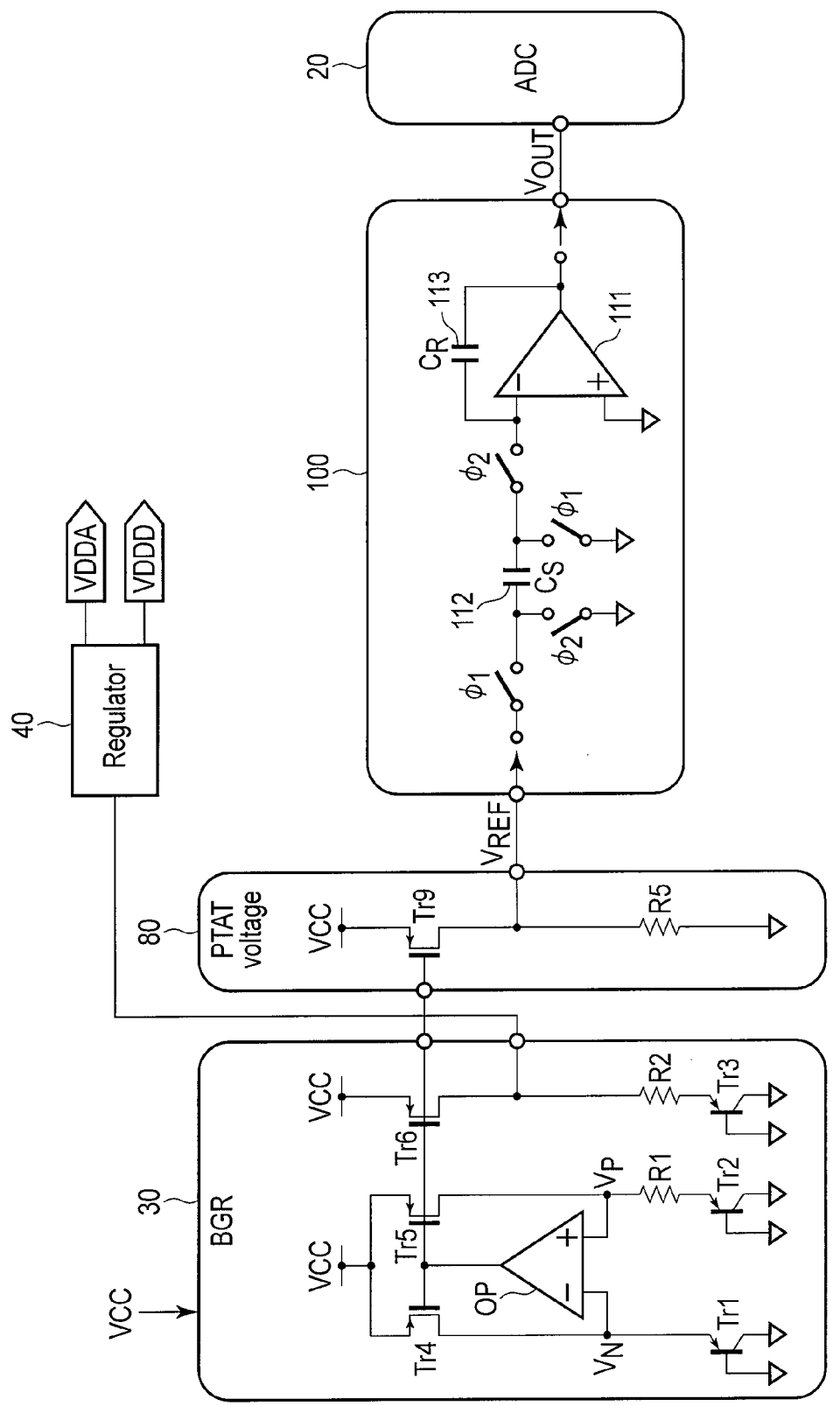
F I G. 11

CAPACITANCE DETECTION DEVICE

CROSS-REFERENCE TO RELATED APPLICATIONS

This application is based upon and claims the benefit of priority from Japanese Patent Application No. 2014-026221, filed Feb. 14, 2014, the entire contents of which are incorporated herein by reference.

FIELD

Embodiments described herein relate generally to a capacitance detection device.

BACKGROUND

As a capacitance detection device used as a pressure detection device (pressure sensor), a device employing a switched capacitor amplifying circuit including a variable capacitor has been proposed.

However, in general, variable capacitors have a temperature characteristic. Therefore, to detect the accurate capacitance of the capacitor, it is desirable to perform appropriate temperature compensation.

BRIEF DESCRIPTION OF THE DRAWINGS

FIG. 1 is a block diagram showing a capacitance detection device according to a first embodiment;

FIG. 2 is a circuit diagram showing a specific structure example of the capacitance detection device according to the first embodiment;

FIG. 3 is a schematic cross-sectional view showing the structures of a variable capacitor and a reference capacitor;

FIG. 4 is a block diagram showing a capacitance detection device according to a second embodiment;

FIG. 6 is a block diagram showing a capacitance detection device according to a third embodiment;

FIG. 8 is a block diagram showing a capacitance detection device according to a fourth embodiment;

FIG. 9 is a circuit diagram showing a specific structure example of the capacitance detection device according to the fourth embodiment;

FIG. 10 is a block diagram showing a capacitance detection device according to a fifth embodiment; and FIG. 11 is a circuit diagram showing a specific structure example of the capacitance detection device according to the fifth embodiment.

DETAILED DESCRIPTION

Figure 5:
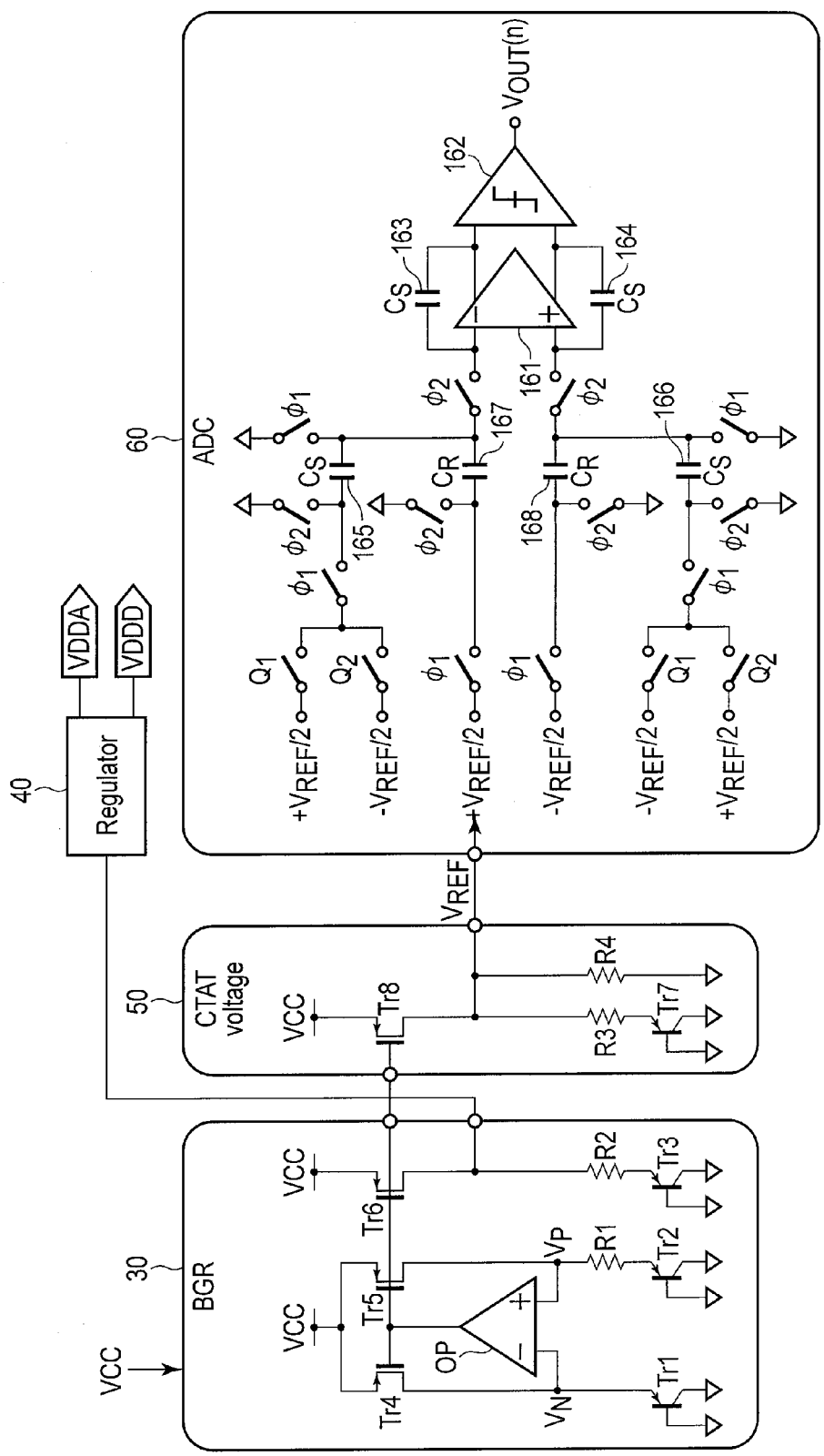
FIG. 5 is a circuit diagram showing a specific structure example of the capacitance detection device according to the second embodiment.

In general, according to one embodiment, a capacitance detection device includes: a switched capacitor amplifying circuit including a variable capacitor and a reference capacitor; and a voltage applying circuit configured to apply, to the switched capacitor amplifying circuit, a reference voltage having a temperature characteristic for compensating fluctuation in an output voltage of the switched capacitor amplifying circuit due to a temperature characteristic of capacitance of the variable capacitor.

Embodiments will be described with reference to the accompanying drawings.

First Embodiment

FIG. 1 is a block diagram showing a capacitance detection device according to a first embodiment. The capacitance detection device of FIG. 1 is used as a pressure detection device (pressure sensor) using an MEMS element.

The capacitance detection device of FIG. 1 includes a switched capacitor amplifying circuit 10, an Analog-to-Digital Converter (ADC) circuit 20, a Band Gap Reference (BGR) circuit 30, a regulator circuit 40 and a Complementary To Absolute Temperature (CTAT) voltage generation circuit 50.

FIG. 2 is a circuit diagram showing a specific structure example of the capacitance detection device according to the first embodiment. As shown in FIG. 2, the switched capacitor amplifying circuit 10 includes an operational amplifier 11, a variable capacitor 12, a reference capacitor 13 and a plurality of switches. The switches receive clock signals $\phi1$ and $\phi2$ of opposite phases.

FIG. 3 is a schematic cross-sectional view showing the structures of the variable capacitor 12 and the reference capacitor 13 included in the switched capacitor amplifying circuit 10.

As shown, a variable capacitor 220 and a reference capacitor 230 are formed on a substrate 210. The variable capacitor 220 and the reference capacitor 230 are formed of MEMS elements. The substrate 210 includes a semiconductor substrate, circuits (e.g., various circuits shown in FIGS. 1 and 2) including transistors and wiring, an interlayer insulating film, etc. The variable capacitor 220 corresponds to the variable capacitor 12 shown in FIG. 2, and the reference capacitor 230 corresponds to the reference capacitor 13 shown in FIG. 2.

The variable capacitor 220 includes a lower electrode 221, an upper electrode 222, and a dielectric film 223 formed on the lower electrode 221. A gap 224 is defined between the upper electrode 222 and an insulating film 223. The reference capacitor 230 includes a lower electrode 231, an upper electrode 232, and a dielectric film 233 formed on the lower electrode 231. A gap 234 is defined between the upper electrode 232 and an insulating film 233. The variable capacitor 220 and the reference capacitor 230 are provided on the same substrate 210.

In the variable capacitor 220, the upper electrode 222 is movable. More specifically, when pressure is applied to the upper electrode 222, the electrode 222 is vertically displaced according to the pressure. As a result, the distance between the lower and upper electrodes 221 and 222 varies to vary the capacitance of the variable capacitor 220. In the reference capacitor 230, the distance between the lower electrode 231 and the upper electrode 232 is fixed. Accordingly, the capacitance of the reference capacitor 230 is constant.

As described above, in the variable capacitor 220, when pressure is applied to the upper electrode 222, the capacitance Cs of the variable capacitor 220 varies. Namely, the capacitance of the variable capacitor 220 varies in accordance with pressure. Accordingly, by detecting the capacitance Cs of the variable capacitor 220, the pressure applied to the upper electrode 222 can be detected.

The output voltage of the switched capacitor amplifying circuit 10 is input to the ADC circuit 20. In the first embodiment, a $\Delta\Sigma$-ADC circuit is used as the ADC circuit 20. In the ADC circuit 20, the output voltage of the switched capacitor amplifying circuit 10 is subjected to AD conversion. Based on the AD-converted value, the capacitance Cs of the variable capacitor 12 of the switched capacitor amplifying circuit 10 is detected to thereby detect the pressure applied to the upper electrode 222 of the capacitance Cs. The ADC circuit 20 includes an adder 21, an integrator 22, a comparator 23 and a delay element 24.

The BGR circuit 30 (first voltage generation circuit) is configured to generate a voltage that does not depend upon temperature. Although the BGR circuit 30 has a portion for generating a voltage that depends upon temperature, it is configured to generate a voltage that does not depend upon temperature, by internally performing compensation. As shown in FIG. 2, the BGR circuit 30 includes an operational amplifier OP, transistors Tr1 to Tr6 and resistors R1 and R2.

The BGR circuit 30 is connected to the regulator circuit 40. The regulator circuit 40 is configured to maintain a constant voltage even when power supply voltage fluctuation has occurred.

The BGR circuit 30 is also connected to the CTAT voltage generation circuit (second voltage generation circuit) 50. More specifically, the CTAT voltage generation circuit 50 receives a voltage from a voltage generation point that is configured to generate a voltage depending upon the temperature in the BGR circuit 30. The voltage at the voltage generation point $V_N$ shown in FIG. 2 may be applied to the CTAT voltage generation circuit 50. The CTAT voltage generation circuit 50 generates a reference voltage $V_{REF}$ as a DC voltage proportional to temperature. More specifically, the CTAT voltage generation circuit 50 generates a voltage of a negative temperature coefficient as the reference voltage $V_{REF}$. The reference voltage $V_{REF}$ output from the CTAT voltage generation circuit 50 is input to the switched capacitor amplifying circuit 10. The CTAT voltage generation circuit 50 includes transistors Tr7 and Tr8 and resistors R3 and R4 as shown in FIG. 2.

The operation of the above-described capacitance detection device will now be described.

The output voltage of the switched capacitor amplifying circuit 10 is proportional to the reference voltage $V_{REF}$, and is inversely proportional to the capacitance of the variable capacitor 12. Accordingly, the output voltage of the switched capacitor amplifying circuit 10 is proportional to $C_R/C_S$, where $C_S$ is the capacitance of the variable capacitor, and $C_R$ is the capacitance of the reference capacitor. Namely, the gain of the switched capacitor amplifying circuit 10 is $C_R/C_S$. Accordingly, the output voltage of the switched capacitor amplifying circuit 10 is $(C_R/C_S)V_{REF}$.

Further, the output voltage $V_{OUT}$ of the ADC circuit 20 is given by $$V_{OUT}=(C_R/C_S)V_{REF}+(1-Z^{-1})N \quad (1)$$

where $Z^{-1}$ is a delay element (e.g., a delay element corresponding to one clock), and N is a quantization error.

Assume here that the capacitance $C_S$ of the variable capacitor 12 exhibits the following characteristic:

$$1/C_S=m_0-a\Delta P+b\Delta T \quad (2)$$

where P is the pressure applied to the variable capacitor 12, and T is the ambient temperature of the variable capacitor 12.

Further, the reference voltage $V_{REF}$ is expressed as follows, based on the characteristics of the CTAT voltage generation circuit 50:

$$V_{REF}=V_0-V_1\Delta T \quad (3)$$

From the equations (1), (2) and (3), $V_{OUT}$ is expressed by $$V_{OUT}=C_R\{m_0V_0-aV_0\Delta P+(bV_0-m_0V_1)\Delta T\}+(1-Z^{-1})N \quad (4)$$

where it is assumed that a and b are sufficiently lower than 1 (a<<1, b<<1), and $\Delta P\Delta T$ can be ignored.

As expressed in the equation (4), the coefficient of $\Delta T$ is "$bV_0-m_0V_1$." Namely, the coefficient of $\Delta T$ includes a positive term "$bV_0$" and a negative term "$-m_0V_1$." The positive term "$bV_0$" serves to offset the negative term "$-m_0V_1$." As a result, the influence of the temperature change $\Delta T$ on the output voltage can be suppressed. In the first embodiment, when the capacitance $C_S$ of the variable capacitor 12 is expressed by the equation (2), the use of the CTAT voltage generation circuit 50 expressed by the equation (3) suppresses the influence of the temperature change $\Delta T$.

Thus, in the first embodiment, a voltage applying circuit is formed by the BGR circuit 30 and the CTAT voltage generation circuit 50, and is used to generate a reference voltage $V_{REF}$ having a temperature characteristic capable of compensating fluctuation in the output voltage of the switched capacitor amplifying circuit 10 due to a temperature characteristic of capacitance of the variable capacitor 12, and to apply the reference voltage $V_{REF}$ to the switched capacitor amplifying circuit 10.

As described above, in the first embodiment, temperature compensation is performed using the reference voltage $V_{REF}$ generated by the voltage applying circuit, with the result that fluctuation in the output voltage due to the temperature characteristic of the variable capacitor can be accurately compensated for, and hence an accurate capacitance (accurate pressure) can be detected.

Further, a BGR circuit is used as a first voltage generation circuit providing a part of the voltage applying circuit. Since the BGR circuit is used in a standard capacitance detection device, the above-mentioned temperature compensation can be performed without adding a large number of new circuits. As a result, the above-described capacitance detection device can be made without adding a large number of circuits.

Second Embodiment

A description will be given of a second embodiment. The second embodiment is similar to the first embodiment in basic structure. In this section, the matters referred to in the first embodiment will not be described.

FIG. 4 is a block diagram showing a capacitance detection device according to the second embodiment. The capacitance detection device of the second embodiment is also used as a pressure detection device (pressure sensor). FIG. 5 is a circuit diagram showing a specific structure example of the capacitance detection device. In the second embodiment, elements similar to those of the first embodiment are denoted by corresponding reference numbers, and no detailed description will be given thereof.

In the above-described first embodiment, the switched capacitor amplifying circuit 10 and the ADC circuit 20 are separate circuits. However, in the second embodiment, the switched capacitor amplifying circuit is incorporated in the ADC circuit to thereby form an ADC circuit 60. The other basic structure is similar to the first embodiment.

The ADC circuit 60 includes an adder 61, an integrator 62, a comparator 63, a delay element 64 and amplifiers 65 and 66. The gain of the amplifier 65 is $C_S/C_S$, while that of the amplifier 66 is $C_R/C_S$.

As shown in FIG. 5, the ADC circuit 60 includes an operational amplifier 161, a comparator 162, variable capacitors 163 to 166, reference capacitors 167 and 168, and a plurality of switches. The switches receive clock signals φ1 and φ2 of opposite phases. The switches, to which Q1 is supplied, turn on when Q1=1, while the switches, to which Q2 is supplied, turn on when Q2=1.

The BGR circuit 30, the regulator circuit 40 and the CTAT voltage generation circuit 50 are similar in basic structure to those of the first embodiment.

Also in the second embodiment, the above-mentioned equations (1) to (4) are established. Accordingly, the second embodiment can provide the same advantage as that of the first embodiment.

Third Embodiment

A third embodiment will be described. The third embodiment is similar to the first embodiment in basic structure. Also in this section, the matters referred to in the first embodiment will not be described.

Figure 7:
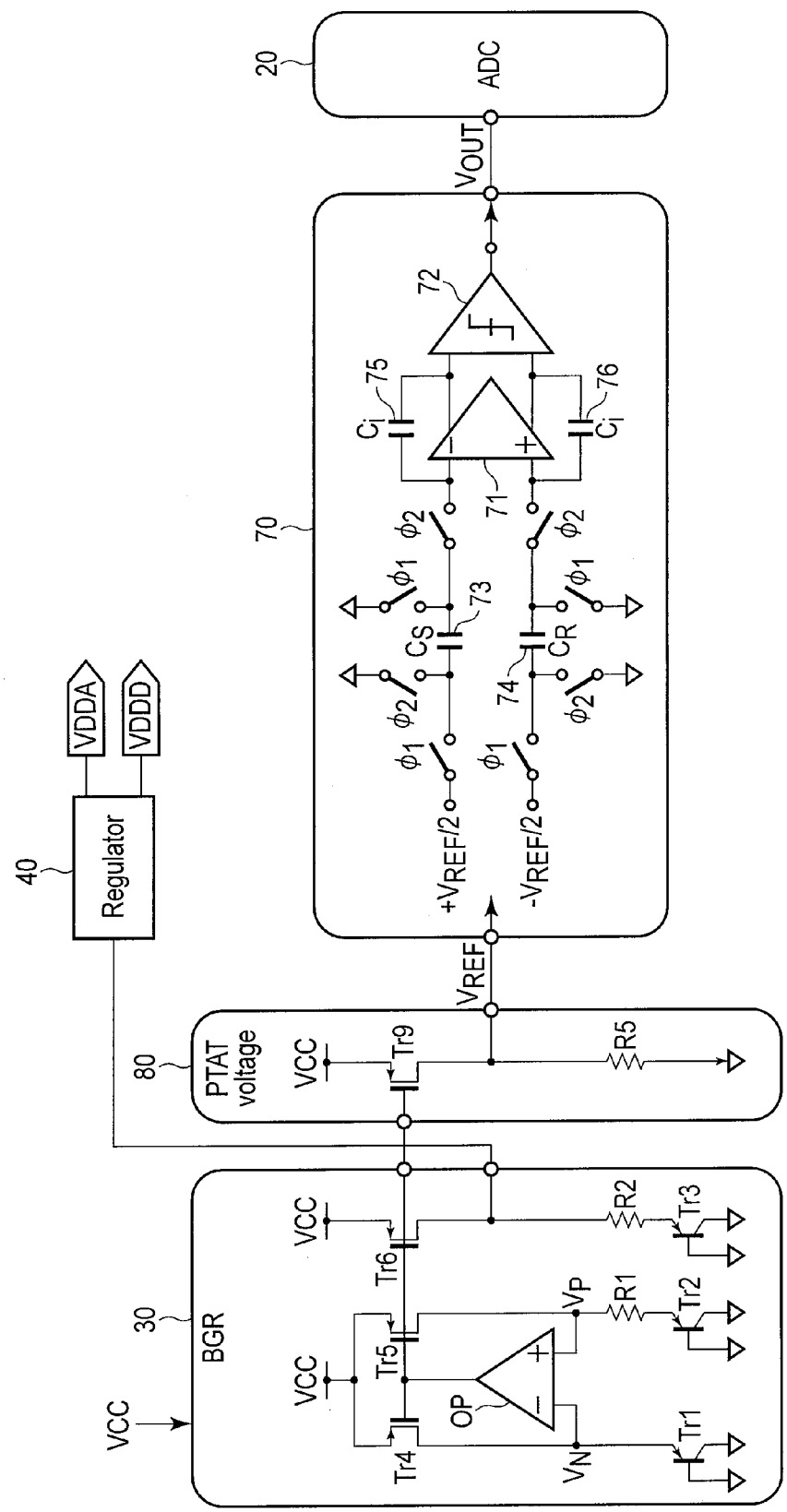
FIG. 7 is a circuit diagram showing a specific structure example of the capacitance detection device according to the third embodiment.

FIG. 6 is a block diagram showing a capacitance detection device according to the third embodiment. The capacitance detection device of FIG. 6 is also used as a pressure detection device (pressure sensor). FIG. 7 is a circuit diagram showing a specific structure example of the capacitance detection device. In the third embodiment, elements similar to those of the first embodiment are denoted by corresponding reference numbers, and no detailed description will be given thereof.

As shown in FIG. 7, in the third embodiment, a switched capacitor amplifying circuit 70 includes an operational amplifier 71, a comparator 72, a variable capacitor 73, a reference capacitor 74, feedback capacitors 75 and 76, and a plurality of switches. The switches receive clock signals φ1 and φ2 of opposite phases.

Further, the third embodiment employs, as a second voltage generation circuit, a Proportional To Absolute Temperature (PTAT) voltage generation circuit 80 configured to generate a voltage having a positive temperature coefficient. The PTAT voltage generation circuit 80 receives, from a voltage generation point, a voltage depending upon the temperature in the BGR circuit 30. Alternatively, the PTAT voltage generation circuit 80 may receive a voltage from the voltage generation point $V_N$ shown in FIG. 7. The PTAT voltage generation circuit 80 generates the reference voltage $V_{REF}$, as a DC voltage proportional to temperature. More specifically, the PTAT voltage generation circuit 80 generates, as the reference voltage $V_{REF}$, a voltage of a positive temperature coefficient. The reference voltage $V_{REF}$ generated from the PTAT voltage generation circuit 80 is input to the switched capacitor amplifying circuit 70. The PTAT voltage generation circuit 80 includes a transistor Tr9 and a resistor R5.

The ADC circuit 20, the BGR circuit 30 and the regulator circuit 40 are similar in basic structure to those of the first embodiment.

The output voltage of the switched capacitor amplifying circuit 70 is proportional to the reference voltage $V_{REF}$, and is also proportional to the capacitance of the variable capacitor 73. The output voltage of the switched capacitor amplifying circuit 70 is proportional to $(C_S-C_R)/Ci$, where $C_S$ is the capacitance of the variable capacitor, $C_R$ is the capacitance of the reference capacitor, and Ci is the capacitance of each of the feedback capacitors 75 and 76. Namely, the gain of the switched capacitor amplifying circuit 70 is $(C_S-C_R)/Ci$.

Accordingly, the output voltage $V_{OUT}$ of the ADC circuit 20 is given by $$V_{OUT} = \{(C_S-C_R)/Ci\}V_{REF} + (1-Z^{-1})N \quad (5)$$

where $Z^{-1}$ is a delay element (e.g., a delay element corresponding to one clock), and N is a quantization error.

The capacitance $C_S$ of the variable capacitor 73 is supposed to have the following characteristic:

$$C_S = m_0 + a\Delta P - b\Delta T \quad (6)$$

where P is the pressure applied to the variable capacitor 73, and T is the ambient temperature of the variable capacitor 73.

Further, the reference voltage $V_{REF}$ is given by the following equation, based on the characteristics of the PTAT voltage generation circuit 80:

$$V_{REF} = V_0 + V_1\Delta T \quad (7)$$

From the equations (5), (6) and (7), $V_{OUT}$ is given by $$V_{OUT} = [(m_0-C_R)V_0 + aV_0\Delta P + \{-bV_0+(m_0-C_R)V_1\}\Delta T]/Ci + (1-Z^{-1})N \quad (8)$$

where a and b are sufficiently lower than 1, and the terms $\Delta P\Delta T$ can be ignored.

As is shown in the equation (8), the coefficient of $\Delta T$ is $\{-bV_0+(m_0-C_R)V_1\}$. Namely, the coefficient of $\Delta T$ includes a negative term $(-bV_0)$ and a positive term $(m_0-C_R)V_1$. Thus, the negative and positive terms $(-bV_0)$ and $(m_0-C_R)V_1$ function to offset each other. Consequently, the influence of the temperature variation $\Delta T$ upon the output voltage can be suppressed. In the third embodiment, where the capacitance $C_S$ of the variable capacitor 12 is expressed by the equation (6), the influence of the temperature variation $\Delta T$ is suppressed by means of the PTAT voltage generation circuit 80 expressed by the equation (7).

Also in the third embodiment, temperature compensation is performed using the reference voltage $V_{REF}$ generated by the voltage applying circuit (formed of the BGR circuit 30 and the PTAT voltage generation circuit 80). Accordingly, the third embodiment can provide the same advantage as the first embodiment.

Fourth Embodiment

A fourth embodiment will be described. The fourth embodiment is similar to the first to third embodiments in basic structure. In this section, the matters referred to in the first to third embodiments will not be described.

FIG. 8 is a block diagram showing a capacitance detection device according to the fourth embodiment. The capacitance detection device of FIG. 8 is also used as a pressure detection device (pressure sensor). FIG. 9 is a circuit diagram showing a specific structure example of the capacitance detection device of the fourth embodiment. In the fourth embodiment, elements similar to those of the first to third embodiments are denoted by corresponding reference numbers, and no detailed description will be given thereof.

In the above-described third embodiment, the switched capacitor amplifying circuit 70 and the ADC circuit 20 are formed separate from each other. In contrast, in the fourth embodiment, an ADC circuit 90 is formed by incorporating a switched capacitor amplifying circuit in an ADC circuit. The other basic structure of the fourth embodiment is similar to that of the third embodiment.

The ADC circuit 90 includes an adder 91, an integrator 92, a comparator 93, a delay element 94 and amplifiers 95 and 96. The gain of the amplifier 95 is $(C_{fb}/Ci)$, and that of the amplifier 96 is $(C_S-C_R)/Ci$. It is supposed here that $(C_{fb}/Ci)$ is 1.

As shown in FIG. 9, the ADC circuit 90 includes an operational amplifier 191, a comparator 192, feedback capacitors 193 and 194, capacitors 195 and 196, a variable capacitor 197, a reference capacitor 198, and a plurality of switches. The switches receive clock signals φ1 and φ2 of opposite phases. The switches, to which Q1 is supplied, turn on when Q1=1, while the switches, to which Q2 is supplied, turn on when Q2=1.

The BGR circuit 30, the regulator circuit 40 and the PTAT voltage generation circuit 80 are similar in basic structure to those of the third embodiment.

Also in the fourth embodiment, the equations (5) to (8) employed in the third embodiment are established. Accordingly, the fourth embodiment can provide the same advantage as that of the first and third embodiments.

Fifth Embodiment

A fifth embodiment will be described. The fourth embodiment is similar to the first embodiment in basic structure. In this section, the matters referred to in the first embodiment will not be described.

FIG. 10 is a block diagram showing a capacitance detection device according to the fifth embodiment. The capacitance detection device of FIG. 10 is also used as a pressure detection device (pressure sensor). FIG. 11 is a circuit diagram showing a specific structure example of the capacitance detection device according to the fifth embodiment. In the fifth embodiment, elements similar to those of the first embodiment are denoted by corresponding reference numbers, and no detailed description will be given thereof.

In the first embodiment, the gain of the switched capacitor amplifying circuit 10 is $C_R/C_S$, while in the fifth embodiment, that of a switched capacitor amplifying circuit 100 is $C_S/C_R$.

The switched capacitor amplifying circuit 100 includes an operational amplifier 111, a variable capacitor 112, a reference capacitor 113, and a plurality of switches. The switches receive clock signals φ1 and φ2 of opposite phases.

As mentioned above, since in the fifth embodiment, the gain of the switched capacitor amplifying circuit 100 is $C_S/C_R$, the output voltage of the switched capacitor amplifying circuit 100 is proportional to the capacitance of the variable capacitor 112. Namely, the output voltage of the switched capacitor amplifying circuit 100 is proportional to $C_S/C_R$, where $C_S$ is the capacitance of the variable capacitor, and $C_R$ is the capacitance of the reference capacitor.

The ADC circuit 20, the BGR circuit 30 and the regulator circuit 40 of the fifth embodiment are similar in basic structure to those of the first embodiment. Further, the PTAT voltage generation circuit 80 of the fifth embodiment is similar in basic structure to that of the third embodiment.

In the fifth embodiment, the output voltage $V_{OUT}$ of the ADC circuit 20 is given by $$V_{OUT} = (C_S/C_R)V_{REF} + (1-Z^{-1})N \quad (9)$$

where $Z^{-1}$ is a delay element (e.g., a delay element corresponding to one clock), and N is a quantization error.

The capacitance $C_S$ of the variable capacitor 112 is supposed to have the following characteristic:

$$C_S = m_0 + a\Delta P - b\Delta T \quad (10)$$

where P is the pressure applied to the variable capacitor 112, and T is the ambient temperature of the variable capacitor 112.

Further, the reference voltage $V_{REF}$ is given by the following equation, based on the characteristics of the PTAT voltage generation circuit 80:

$$V_{REF} = V_0 + V_1\Delta T \quad (11)$$

From the equations (9), (10) and (11), $V_{OUT}$ is given by $$V_{OUT} = (1/C_R)\{m_0V_0 + aV_0\Delta P + (-bV_0 + m_0V_1)\Delta T\} + (1-Z^{-1})N \quad (12)$$

where a and b are sufficiently lower than 1, and the terms $\Delta P\Delta T$ can be ignored.

As is shown in the equation (12), the coefficient of $\Delta T$ is $(-bV_0 + m_0V_1)$. Namely, the coefficient of $\Delta T$ includes a negative term $(-bV_0)$ and a positive term $(m_0V_1)$. Thus, the negative and positive terms $(-bV_0)$ and $(m_0V_1)$ function to offset each other. Consequently, the influence of the temperature variation $\Delta T$ upon the output voltage can be suppressed. In the fifth embodiment, where the capacitance $C_S$ of the variable capacitor 112 is expressed by the equation (10), the influence of the temperature variation $\Delta T$ is suppressed by means of the PTAT voltage generation circuit 80 expressed by the equation (11).

As is evident from the above, the fifth embodiment can provide the same advantage as the first embodiment.

Also in the fifth embodiment, the switched capacitor amplifying circuit may be incorporated in the ADC circuit, as in the second embodiment.

Although in the above-described first to fifth embodiments, a first-order $\Delta\Sigma$-ADC circuit is used, a two-order or more $\Delta\Sigma$-ADC circuit may be used.

Further, although in the first to fifth embodiments, the ADC circuit is formed of the $\Delta\Sigma$-ADC circuit, it may be formed of an ADC circuit of another scheme.

In addition, in the above-described first to fifth embodiments, the BGR circuit, the CTAT circuit, the PTAT circuit, etc., may be formed in the same substrate on which the MEMS element is formed. If these circuits are formed in the same substrate, the resultant device will be almost free from the influence of external noise.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A capacitance detection device comprising:
a switched capacitor amplifying circuit including a variable capacitor and a reference capacitor; and
a voltage applying circuit configured to apply, to the switched capacitor amplifying circuit, a reference voltage having a temperature characteristic for compensating fluctuation in an output voltage of the switched capacitor amplifying circuit due to a temperature characteristic of capacitance of the variable capacitor;
wherein the voltage applying circuit includes a first voltage generation circuit configured to generate a voltage that does not depend on a temperature; and
wherein the voltage applying circuit includes a second voltage generation circuit configured to receive a voltage from the first voltage generation circuit and to generate a voltage proportional to a temperature.

2. The device of claim 1, wherein the reference voltage is proportional to a temperature.

3. The device of claim 1, wherein the first voltage generation circuit includes a Band Gap Reference (BGR) circuit.

4. The device of claim 1, wherein:
the first voltage generation circuit has a voltage generation point for generating a voltage depending on a temperature; and
the second voltage generation circuit receives the voltage from the voltage generation point of the first voltage generation circuit.

5. The device of claim 1, wherein the second voltage generation circuit includes a Complementary To Absolute Temperature (CTAT) voltage generation circuit.

6. The device of claim 1, wherein the second voltage generation circuit includes a Proportional To Absolute Temperature (PTAT) voltage generation circuit.

7. The device of claim 1, wherein the output voltage of the switched capacitor amplifying circuit is proportional to the reference voltage.

8. The device of claim 1, wherein the output voltage of the switched capacitor amplifying circuit is proportional or inverse proportional to the capacitance of the variable capacitor.

9. The device of claim 1, wherein the output voltage of the switched capacitor amplifying circuit is proportional to $C_R/C_S$ where $C_S$ is a capacitance of the variable capacitor, and $C_R$ is a capacitance of the reference capacitor.

10. The device of claim 1, wherein the output voltage of the switched capacitor amplifying circuit is proportional to $C_S/C_R$ where $C_S$ is a capacitance of the variable capacitor, and $C_R$ is a capacitance of the reference capacitor.

11. The device of claim 1, wherein the output voltage of the switched capacitor amplifying circuit is proportional to $(C_S-C_R)$ where $C_S$ is a capacitance of the variable capacitor, and $C_R$ is a capacitance of the reference capacitor.

12. The device of claim 1, wherein the capacitance of the variable capacitor varies in accordance with a pressure.

13. The device of claim 1, wherein the switched capacitor amplifying circuit is included in an A/D conversion circuit.

14. The device of claim 1, wherein the variable capacitor is formed of an MEMS element.

* * * * *